INVENTOR.
JOHANNES A. GREEFKES
BY
Frank R. Trifari
AGENT

INVENTOR.
JOHANNES A. GREEFKES
BY
Frank R. Jifani
AGENT 3,407,315
TRANSISTOR DEVICE Johannes Anton Greefkes, Emmasingel, Eindhoven, Netherlands, assignor to North American Philips Company, Inc., New York, N.Y., a corporation of Delaware
Filed Mar. 1, 1966, Ser. No. 530,954
Claims priority, application Netherlands, Mar. 30, 1965, 6503993
3 Claims. (Cl. 307—299)

The invention relates to a transistor device, more particularly for use in integrated circuit arrangements, in which the current through the emitter-collector path is controlled at the base by means of a control voltage. The control voltage may be sufficiently high such that the transistor operates, for example as an electronic switch. Such devices are used, for example, for putting a load in operation or in trigger arrangements. An electronic switch of this type should exhibit a maximum (blocking) resistance in the blocked state and a minimum (pass) resistance and, also, a minimum voltage drop in the conducting state. Since the transistor must draw high currents in the blocked state, a disadvantage was experienced in that the remaining voltage between emitter and collector, the so-called knee voltage, could have an undesirably high value, for example, of the order of 0.8 v. If the supply voltage used is comparatively low and/or if the transistor device forms part of a trigger arrangement, this high knee-voltage may give rise to difficulties in the remaining part of the arrangement, more particularly with respect to its reliability and its insensitivity to operating conditions such as variations in temperature and in supply voltage.

The device in accordance with the invention is characterized in that the collector zone is provided with a first connecting contact connected with the supply source for conveying a comparatively high current and with a second connecting contact connected with a load absorbing only a low current. The second contact is arranged with respect to the first connecting contact so that it exhibits, when the transistor is conducting, a considerably smaller potential difference with respect to the emitter than the first-mentioned connecting contact.

The invention will now be described more fully with reference to the drawing.

Figure 1:
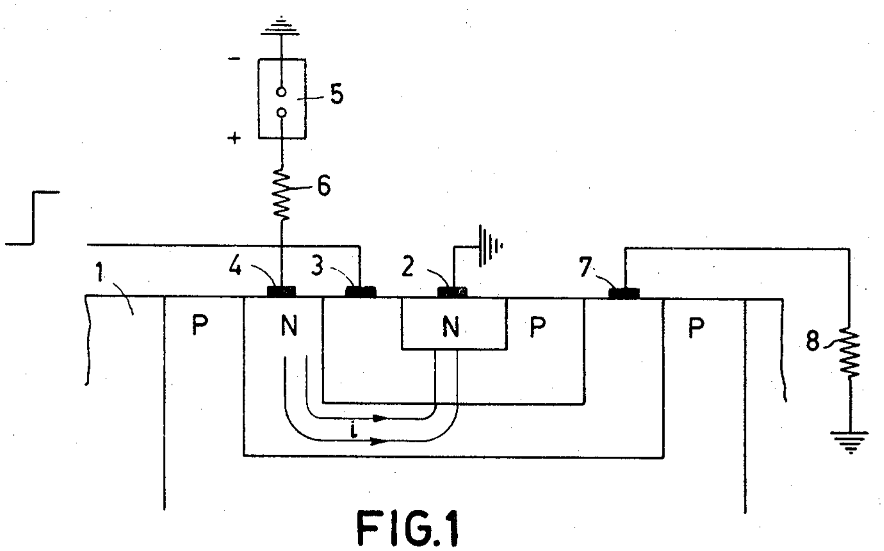
FIG. 1 shows an embodiment in accordance with the invention.

The semi-conductor device shown in FIG. 1 has a semi-conductor crystal 1 on or in close proximity of the surface of which zones of alternating conductivity types are arranged with the aid of the planar technique, more particularly in conjunction with the epitaxial process, as a result of which a transistor configuration is formed. The emitter zone is connected with an emitter connecting contact 2, the base zone with a base connecting contact 3, the collector zone with collector connecting contacts 4 and 7. The application of a switching voltage to the base (in the embodiment shown a positive voltage, in which case the emitter zone is of the n-type, the base zone of the p-type and the collector zone again of the n-type) results in that the current path between the emitter contact 2 and the collector contact 4 becomes low-ohmic and also the voltage drop is low. The voltage of the voltage source 5 is now absorbed for the major part by a resistor 6 in the circuit from the collector contact 4 to the supply source 5. It is found, however, that with comparatively high currents, the difference left between the emitter contact 2 and the collector contact 4 still remains comparatively great, i.e. of the order of 0.8 v. This is due to the fact that the collector current, before it reaches the connecting contact 4, must pass through the collector zone which especially in case of planar transistors may constitute a resistance which is not to be neglected, for example, of the order of 200Ω.

The invention is based on the recognition of the fact that with respect to the emitter contact 2 a considerably smaller voltage difference is measured at a second collected contact 7 provided on the collector zone mainly outside the path of the current flowing in the conducting state of the transistor from the emitter through the base zone and the collector zone to the collector contact 4 than at the collector contact 4, since these current paths *i* bring about a voltage drop across the collector zone, the voltage immediately at the junction layer between the collector zone and the base zone opposite the emitter approaching most closely that of the emitter. The contact 7 is connected with an output circuit 8 in which flows a considerably low current than in the circuit 5, 6 so that indeed the voltage drop produced by the current through the circuit 7, 8 is considerably lower than the voltage drop of the current *i* flowing through the collector contact 4.

Figure 2:
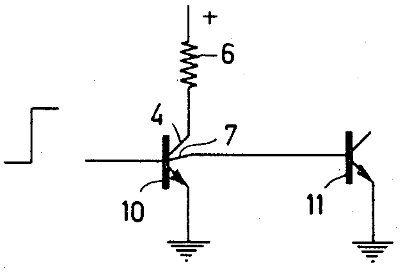
FIG. 2 illustrates the use of the device shown in FIG. 1 as an electronic switch.

This low voltage drop is particularly of importance if, for example, with the transistor device shown in FIG. 1 a subsequent transistor must be switched. This is frequently the case, for example, in calculating and control circuits. In FIG. 2, reference numeral 10 designates diagrammatically the semi-conductor device of FIG. 1, the collector contacts 4 and 7 again corresponding with those of FIG. 1. The emitters are at the same potential, for example, at earth potential. The load is constituted by the input circuit of a transistor 11 which is in the conducting state in case the switching voltage at the base of the transistor 10 blocks this transistor; for a current then flows from the supply source through the resistor 6 and the collector zone between the contacts 4 and 7 to the base of the transistor 11. If on the contrary the switching voltage at the base of the transistor 10 renders this transistor conducting up to the state of saturation, the resistor 6 will absorb the supply voltage for the major part so that a voltage difference of approximately 0.8 v. remains between the collector 4 and the emitter of the transistor 10. However, the voltage difference between the collector 7 and the emitter of the transistor 10 is then only 0.3 v., which is lower than the internal input threshold voltage of the transistor 11, so that this transistor 11 is blocked.

Figure 3:
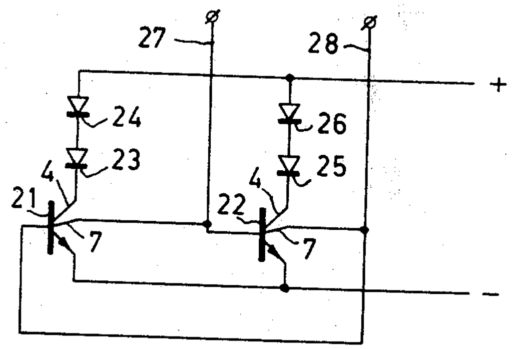
FIG. 3 illustrates such a use in a trigger arrangement.

FIG. 3 shows an example of the use of such a device in which two transistors 21 and 22 of the type shown in FIG. 1 are included in a trigger arrangement. The collector impedances of these transistors are constituted semi-conductor p-n junction by diodes 23, 24 and 25, 26, respectively, which are polarized by the respective transistor collector currents in the forward direction and which are preferably arranged on the same semi-conductor body as the transistors 21 and 22 (integrated circuit arrangement). The collector electrodes 4 of one transistor (21 and 22 respectively) not connected to these diodes are connected with the base electrodes of the other transistor (22 and 21 respectively). By the use of two series-connected diodes in each collector circuit, the loop amplification becomes accurately equal to 4 also with a low current adjustment, the fact being taken into account that with the use of the same semi-conductor material the voltage drops across each of the transistors are accurately equal to each other in the (non-stable) state in which these transistors convey the same current, irrespective of variations in supply voltage and in temperature. In this manner, a very reliable circuit arrangement is obtained which can be changed from one conduction state to the other with the aid of trigger voltages at the terminals 27 and 28, respectively, in which case the voltage level at which change-over from one conduction state to the other takes place has very steep flanks and is substantially not influenced by variations in the operating condition. The output signal is preferably derived from one of the collector electrodes 7, if desired, through a separation amplifier.

It goes without saying that ring counters and the like can be constructed in a similar manner. As is known, given effects can be produced when networks (passing direct current) are included between the collector contact 7 of one transistor and the base contact of the other. For example, when the parallel-combination of a resistor and a capacitor is included in this circuit, this may lead to a high switching speed with a low rest current in the non-blocked transistor. If on the contrary in this circuit a resistor is followed by a capacitor in the transverse branch of this circuit to a point of constant potential (for example parallel to the base-emitter path of the second transistor), after the first transistor has been blocked, the second transistor becomes conducting only after a given delay time. If such networks are included in both circuits between the collector contact of one transistor and the base contact of the other transistor, for example, an astable trigger arrangement can be obtained.

The transistor device shown in FIGS. 1 and 2, respectively, may also advantageously be used in amplifier circuit arrangements in which it is the intention to amplify signals having very wide frequency bands and to stabilize the working point of the transistor by means of direct current and alternating current negative feedback, while nevertheless substantially no direct current flows through the negative feedback leads so that the negative feedback factor can be varied without influencing the direct-current adjustment of the transistors.

Figure 4:
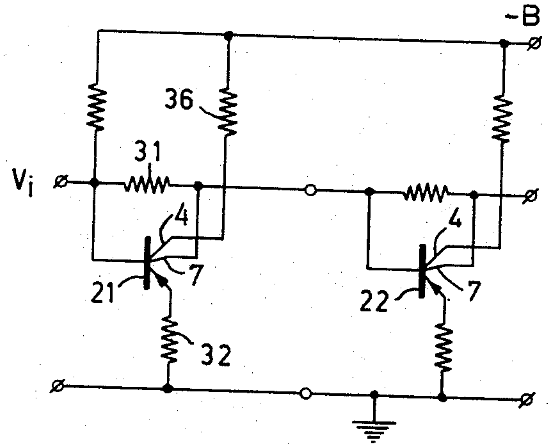
FIG. 4 shows the use of the device shown in FIG. 1 in an amplifier having working-point stabilization.

FIG. 4 shows an embodiment of such a device. The signals $V_i$ to be amplified are supplied to the base of a first transistor 21 of the type described with reference to FIG. 1 and a resistor 36 is included in the circuit between one collector 4 and the supply source B, while the other collector electrode 7 is directly connected with the base of a second transistor. The second collector electrode 7 is likewise connected through a negative feedback resistor 31 to the base of a transistor 21, while furthermore a resistor 32 is included in the emitter circuit of this transistor. The resistors 31 and 32 can be proportioned so that the input and output impedances of the transistor amplifier 21, 31, 32, 36 are equal to each other. This permits of obtaining a simple adaptation to input and output circuits, for example, of a telephone cable and a relative adaptation between the amplifiers, while the amplification characteristic curve is found to have a flat course even in a wider frequency range than could be expected from the addition of the characteristic curves of the individual amplifiers.

The chosen transistor type renders it possible that the direct voltage at the base and that at the collector electrode 7 of the transistor 21 are chosen to be substantially equal to each other. No direct current then flows through the resistor 31 and a variation of this resistor 31 for varying the negative feedback or for adjusting the input and output impedances to the correct values does not influence the direct current adjustment of the transistor 21. If there should be a risk of variation of the working point of the transistor 21, the direct-current negative feedback across the resistor 31 produces such a variation of the base direct current of the transistor 21 that this shift of the working point is counteracted.

A numerical example serves for further explanation: The bases of the transistors are adjusted, for example, to −0.8 v. with respect to their emitters. The internal emitter-base threshold voltage amounts to 0.7 v. By a suitable choice of the resistor 32 and 36, the direct voltage at the collector 7 is at the given value of the supply voltage −B likewise adjusted to −0.8 v. with respect to the emitter. This direct voltage is also the base direct voltage of the transistor 22. The voltage at the collector 4 of the transistor 21 then amounts, for example, to −1.4 v. with respect to its emitter. The transistor can now be excited until the voltage at the collector drops to −0.2 v. with respect to the emitter without the occurrence of collector current saturation. If on the contrary only the collector 4 should be available, at such a direct-current adjustment that the voltage at this collector would also amount to −0.8 v. with respect to this emitter, just a voltage=−0.2 v. with respect to the emitter would be found at the collector-base junction layer so that upon excitation the transistor would pass to the saturation state.

What is claimed is:

1. A circuit arrangement comprising:
  a first transistor including:
    a first body of semiconductor material, said body having a major surface;
    a first zone of one conductivity type extending into said body from said surface forming a collector region;
    a second zone of opposite conductivity type inset into said first zone from said surface forming a base region;
    a first p-n junction formed between said first and second zones, said p-n junction extending to said surface and surrounding said second zone;
    a third zone of said first conductivity type inset into said second zone from said surface forming an emitter region;
    a second p-n junction formed between said second and third zones, said second p-n junction extending to said surface and surrounding said third zone;
    first collector contact means contacting said first zone at said surface;
    emitter contact means contacting said third zone at said surface;
    said first collector contact means and said emitter contact means establishing a current path between said first and third zones through said second zone;
    means for applying a first potential between said first collector contact means and said emitter contact means;
    base contact means contacting said second zone at said surface;
    means for applying a second potential to said base contact means to control the current flow between said first collector contact means and said emitter contact means;
    second collector contact means contacting said first zone at said surface, said second collector contact means being remote both from said current path and from said first collector contact means;
    load means connected to said second collector contact means, said load means comprising a second transistor;
  said second transistor including:
    a body of semiconductor material, said body having a major surface;
    a first zone of one conductivity type extending into said body from said surface forming a collector region;
    a second zone of opposite conductivity type inset into said first zone from said surface forming a base region;
    a first p-n junction extending to said surface and surrounding said second zone;
    a third zone of said first conductivity type inset into second zone from said surface forming an emitter region;
    a second p-n junction formed between said second and third zones, said second p-n junction extending to said surface and surrounding said third zone;

first collector contact means contacting said first zone at said surface;

emitter contact means contacting said third zone at said surface;

said first collector contact means and said emitter contact means establishing a current path between said first and third zones through said second zone;

means for applying a first potential between said first collector contact means and said emitter contact means;

base contact means contacting said second zone at said surface;

means for applying a second potential to said base contact means to control the current flow between said first collector contact means and said emitter contact means;

second collector contact means contacting said first zone at said surface, said second collector being remote both from said current path and from said first collector contact means;

said second collector contact means of said first transistor directly connected to said base contact means of said second transistor;

a further load means connected to said second collector means of said second transistor;

and each of said means for applying a first potential includes a first and second serially connected p-n junction diodes, each of said p-n junction diodes polarized in the forward direction by each of their respective transistor current paths.

2. The combination of claim 1 wherein each of said emitter zones are connected to a point of reference potential.

3. A circuit arrangement comprising:

a first transistor including:

a first body of semiconductor material, said body having a major surface;

a first zone of one conductivity type extending into said body from said surface forming a collector region;

a second zone of opposite conductivity type inset into said first zone from said surface forming a base region;

a first p-n junction formed between said first and second zones, said p-n junction extending to said surface and surrounding said second zone;

a third zone of said first conductivity type inset into said second zone from said surface forming an emitter region;

a second p-n junction formed between said second and third zones, said second p-n junction extending to said surface and surrounding said third zone;

first collector contact means contacting said first zone at said surface;

emitter contact means contacting said third zone at said surface;

said first collector contact means and said emitter contact means establishing a current path between said first and third zones through said second zone;

means for applying a first potential between said first collector contact means and said emitter contact means;

base contact means contacting said second zone at said surface;

means for applying a second potential to said base contact means to control the current flow between said first collector contact means and emitter contact means;

second collector contact means contacting said first zone at said surface, said second contact means being remote both from said current path and from said first collector contact means;

load means connected to said second collector contact means, said load means comprising a second transistor;

said second transistor including:

a body of semiconductor material, said body having a major surface;

a first zone of one conductivity type extending into said body from said surface forming a collector region;

a second zone of opposite conductivity type inset into said first zone from said surface forming a base region;

a first p-n junction extending to said surface and surrounding said second zone;

a third zone of said first conductivity type inset into said second zone from said surface forming an emitter region;

a second p-n junction formed between said second and third zones, said second p-n junction extending to said surface and surrounding said third zone;

first collector contact means contacting said first zone at said surface;

emitter contact means contacting said third zone at said surface;

said first collector contact means and said emitter contact means establishing a current path between said first and third zones through said second zone;

means for applying a first potential between said first collector contact means and said emitter contact means;

base contact means contacting said second zone at said surface;

means for applying a second potential to said base contact means to control the curent flow between said first collector contact means and said emitter contact means;

second collector contact means contacting said first zone at said surface, said second collector contact means being remote both from said current path and from said first collector contact means;

said second collector contact means of said first transistor directly connected to said base contact means of said second transistor;

a further load means connected to said second collector contact means of said second transistor;

and first and second impedance means for providing negative feedback between said second collector contact means and said base contact means of each of the respective transistors, said first and second impedance means connected between said second collector contact means and said base contact means of said first and second transistors respectively, whereby the input and output impedance of each of said transistors may be varied in accordance with said negative feedback.

References Cited

UNITED STATES PATENTS 3,284,677 11/1966 Haas ............ 317—235

JOHN W. HUCKERT, *Primary Examiner.*

J. R. SHEWMAKER, *Assistant Examiner.*